(12) United States Patent
Babb et al.

(10) Patent No.: US 11,799,016 B2
(45) Date of Patent: Oct. 24, 2023

(54) FABRICATION OF ELECTRONIC DEVICES USING SACRIFICIAL SEED LAYERS

(71) Applicant: The Texas A&M University System, College Station, TX (US)

(72) Inventors: Michael Everett Babb, Bryan, TX (US); Harlan Rusty Harris, College Station, TX (US)

(73) Assignee: The Texas A&M University System, College Station, TX (US)

(*) Notice: Subject to any disclaimer, the term of this patent is extended or adjusted under 35 U.S.C. 154(b) by 0 days.

(21) Appl. No.: 17/710,092

(22) Filed: Mar. 31, 2022

(65) Prior Publication Data

US 2022/0223719 A1 Jul. 14, 2022

Related U.S. Application Data

(63) Continuation of application No. 16/968,294, filed as application No. PCT/US2019/019039 on Feb. 21, 2019, now Pat. No. 11,302,800.

(60) Provisional application No. 62/634,677, filed on Feb. 23, 2018.

(51) Int. Cl.
*H01L 29/66* (2006.01)
*H01L 21/02* (2006.01)

(52) U.S. Cl.
CPC .. *H01L 29/66757* (2013.01); *H01L 21/02488* (2013.01); *H01L 21/02532* (2013.01)

(58) Field of Classification Search
None
See application file for complete search history.

(56) References Cited

U.S. PATENT DOCUMENTS

| 7,282,381 | B2  | 10/2007 | Feltin et al. |
| 7,524,739 | B2  | 4/2009  | Lin |
| 7,528,072 | B2* | 5/2009  | Rotondaro ........ H01L 21/30608 257/E21.221 |
| 8,039,371 | B2* | 10/2011 | Bedell ............... H01L 21/02381 438/44 |
| 8,476,085 | B1  | 7/2013  | Zhang et al. |
| 9,218,954 | B2  | 12/2015 | Singh et al. |

* cited by examiner

*Primary Examiner* — Jack S Chen
(74) *Attorney, Agent, or Firm* — Winstead PC

(57) ABSTRACT

A method of making a semiconductor device includes depositing an amorphous layer on a substrate, masking a portion of the amorphous layer, removing a portion of the amorphous layer to form a first channel into the amorphous layer, depositing a semiconductor layer onto the substrate layer, and removing at least a portion of a defect region of the semiconductor layer to form a second channel.

18 Claims, 1 Drawing Sheet

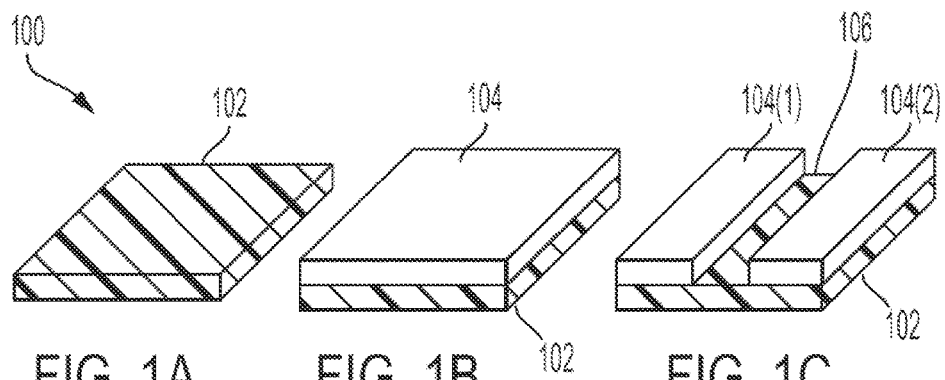
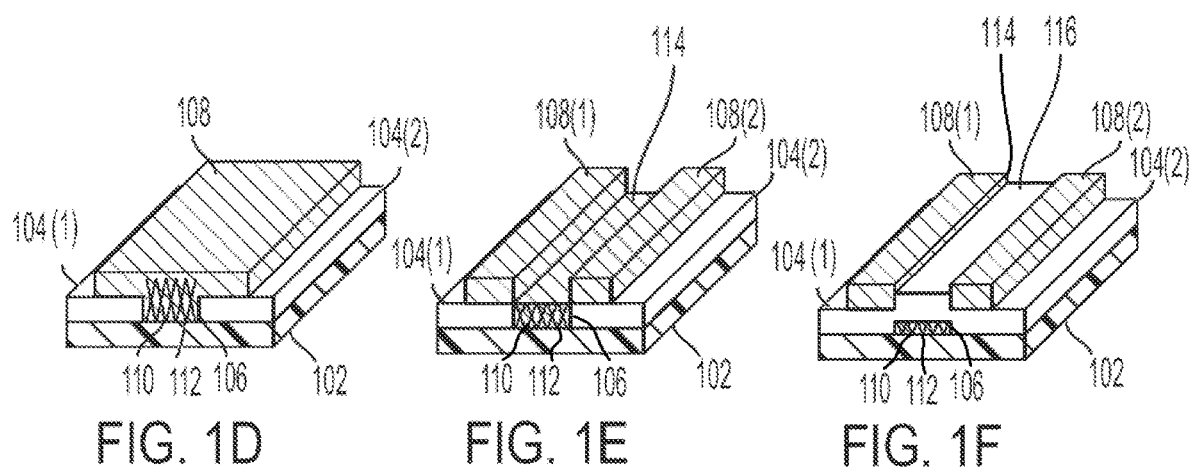
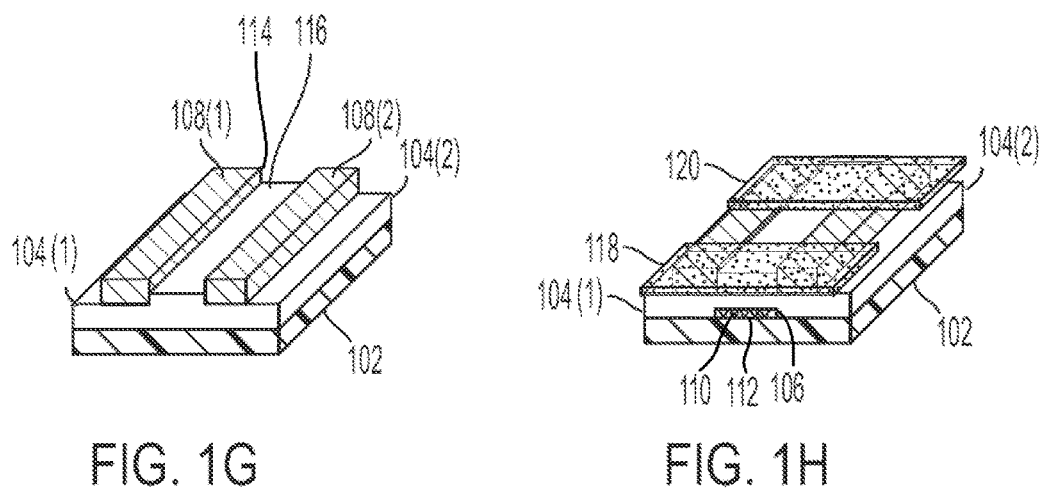

FABRICATION OF ELECTRONIC DEVICES USING SACRIFICIAL SEED LAYERS

CROSS-REFERENCES TO RELATED APPLICATIONS

This application is a continuation of U.S. patent application Ser. No. 16/968,294, now U.S. Pat. No. 11,302,800, filed on Aug. 7, 2020, which is a national stage entry of PCT/US2019/019039, filed on Feb. 21, 2019, which claims priority to U.S. Provisional Patent Application 62/634,677, filed on Feb. 23, 2018. Each of the aforementioned applications are incorporated by reference in their entirety.

BACKGROUND

Technical Field

The present disclosure relates generally to the manufacture of improved power electronics devices (i.e., decreased defects to enhance device performance). For example, and not by way of limitation, the present disclosure relates to fabrication of semiconductors using selective area epitaxy (SAE).

History of Related Art

Deposition (epitaxial growth) of a semiconductor material on a foreign substrate can result in significant defect generation in the semiconductor film due to mismatch in crystal spacing and thermal properties. Defects negatively impact device performance. For example, defects can cause current leakage, lower the breakdown voltage, and change the behavior of the device in the on-state due to electrons becoming trapped.

BRIEF SUMMARY

In an exemplary embodiment, the disclosure relates to a manufacturing process to remove or isolate defect regions of a semiconductor material to enhance device performance. Standard techniques, such as selective area epitaxy, are used to control where crystal growth takes place by patterning an opening in a dielectric. A semiconductor film is grown from the opening in the dielectric and extends over the dielectric mask. The portion of the semiconductor film grown over the mask has significantly less defects as compared to the semiconductor film grown directly above the window. The methods of this disclosure remove the defect region or reduce the amount of defects in the semiconductor film above the window to provide improvements in device fabrication procedures and device electrical performance.

The methods of the disclosure can be applied to integrated or discrete electronic devices to improve device performance. The process can be combined with current technology to improve device performance, yield, and reliability.

An exemplary method of making a semiconductor device includes depositing an amorphous layer on a substrate, masking a portion of the amorphous layer, removing a portion of the amorphous layer to form a first channel into the amorphous layer, depositing a semiconductor layer onto the substrate layer, and removing at least a portion of a defect region of the semiconductor layer to form a second channel. In some embodiments, removing at least a portion of the defect region includes removing an amount of the defect region so that a level of a top surface of the defect region is beneath a bottom surface of the semiconductor layer. In some embodiments, removing at least a portion of the defect region includes removing substantially all of the defect region. In some embodiments, the amorphous layer includes a dielectric material that can be one or more of $SiO_2$, $Si_3N_4$. In some embodiments, the substrate layer includes one or more of AlN, InN, or GaN. In some embodiments, the semiconductor device is a part of a transistor or a diode.

An exemplary semiconductor device includes a substrate layer, an amorphous layer deposited on the substrate layer and comprising a channel that extends from a surface of the amorphous layer to a surface of the substrate layer, and a semiconductor layer disposed on the amorphous layer, wherein the semiconductor layer does not contact the substrate layer. In some embodiments, a semiconductor defect region is disposed between the substrate layer and the amorphous layer. In some embodiments, the semiconductor defect region does not contact the semiconductor layer. In some embodiments, the amorphous layer includes a dielectric material that can be one or more of $SiO_2$, $Si_3N_4$. In some embodiments, the substrate layer includes one or more of AlN, InN, or GaN. In some embodiments, the semiconductor device is a part of a transistor or a diode.

BRIEF DESCRIPTION OF THE DRAWINGS

The disclosure is best understood from the following detailed description when read with the accompanying figures. It is emphasized that, in accordance with standard practice in the industry, various features are not drawn to scale. In fact, the dimensions of various features may be arbitrarily increased or reduced for clarity of discussion.

FIGS. 1A-1H illustrate a method of making a semiconductor device according to embodiments of the disclosure.

DETAILED DESCRIPTION

Embodiment(s) of the disclosure will now be described more fully with reference to the accompanying Drawings. The disclosure may, however, be embodied in many different forms and should not be construed as limited to the embodiment(s) set forth herein. The disclosure should only be considered limited by the claims as they now exist and the equivalents thereof.

Disclosed is a process of making a semiconductor with improved performance and improved reliability. In exemplary embodiments, the process includes selective deposition and etching of a semiconducting material to make a semiconductor with significantly fewer defects, resulting in electronic devices with improved performance and reliability.

Gallium nitride (GaN) is a semiconducting material that is used in high power or high frequency electronic applications. However, to date, a cost effective native substrate does not exist. Therefore, all GaN materials and subsequent devices are grown on non-native substrates. This results in a film that is full of defects and does not perform as well as expected. The defects form, for example, as a result of a mismatch in crystal spacing and thermal properties between the substrate and the dielectric layer. This disclosure describes a cost-effective way to get high quality GaN material that will enable a significant improvement in GaN-based electronic devices.

Referring now to FIGS. 1A-1H, an exemplary method 100 of making an improved semiconductor is shown according to embodiments of the disclosure. Method 100 begins with selection of a substrate 102 (see FIG. 1A). Substrate 102 may be any of a variety of substrates. For example, substrate 102 may comprise one or more of the following: Si (silicon), Al$_2$O$_3$ (sapphire), SiC (silicon carbide), GaN (gallium nitride), AlN (Aluminum Nitride), InN (Indium Nitride), Ga$_2$O$_3$ (gallium oxide), GaAs (gallium arsenide), SiO$_2$ (silicon dioxide), etc. After a substrate is obtained, an amorphous layer 104 is deposited onto substrate 102 (see FIG. 1B). Amorphous layer 104 may be a dielectric layer, a metallic layer, an insulator layer, etc. that helps with selective deposition, which occurs later in method 100. For example, amorphous layer 104 may be one or more of SiO2, Si$_3$N$_4$. In some embodiments, the amorphous layer step may be omitted if the chosen substrate works as a good site for the selective epitaxy in the following steps (e.g., bulk GaN substrates).

After deposition of amorphous layer 104, lithography techniques are used to form a channel 106 into the amorphous layer 104. Lithography techniques include optical lithography, nano-imprint lithography, electron beam lithography, etc. For example, channel 106 may be formed by wet etching or dry etching (see FIG. 1C). Wet etching may be performed with, for example, liquids (e.g., acids). A width of channel 106 can vary based upon the intended application. In various embodiments, the width of channel 106 may be between approximately 2 nm to 100 μm. Dry etching may be performed via plasma based etching. Channel 106 divides amorphous layer 104 into first and second parts 104(1), 104(2) and extends from a top surface of amorphous layer 104 to a top surface of substrate 102.

After channel 106 is formed, deposition techniques can be used (e.g., selective deposition such as selective area epitaxy (SAE)) to deposit a layer of semiconductor material 108 (see FIG. 1D). For example, chemical vapor deposition (CVD) or physical vapor deposition (PVD) can be used to allow growth of semiconductor material 108 to mostly occur inside channel 106. As shown in FIG. 1D, semiconductor material 108 is deposited onto substrate 102 with a portion of semiconductor material 108 extending onto amorphous layer 104. Due to mismatches between the crystal spacing and thermal properties of semiconductor material 108 and substrate 102, defects 110 propagate through semiconductor material 108 in a direction normal to the growth front in a defect region 112. Defects 110 impact device performance and reliability. Semiconductor material 108 can be any of a variety of semiconductor materials, such as, for example, nitrides (e.g., SiN, GaN, InN), Si, GaAS, SiC, and phosphides (e.g., GaP (gallium phosphide), InP (indium phosphide), AlP (aluminum phosphide)).

In order to improve performance and reliability, some or all of defects 110 are removed (see FIG. 1E) via wet or dry etching, forming a channel 114 with portions 108(1), 108(2) on either side thereof (sometimes referred to a lateral epitaxy or pendeo epitaxy). Portions 108(1), 108(2) are relatively free of defects compared to defect region 112. Etching may be performed to partially remove defect region 112 (see FIG. 1F) or to substantially or completely remove defect region 112 (see FIG. 1G). In either case, at least a portion of defect region 112 is removed so that portions 108(1), 108(2) are isolated from defect region 112 and from substrate 102. In other words, portions 108(1), 108(2) do not contact substrate 102 or defect region 112. Isolating portions 108(1), 108(2) as shown in FIGS. 1F and 1G improves device performance by effectively removing defects 110 from the semiconductor. In FIG. 1F, portions 108(1), 108(2) are isolated from defect region 112 by partially removing defects 110 to a depth such that adding an additional amorphous layer 116 (similar to layer 104) on top of defect region 112 separates portions 108(1), 108(2) from contact with defect region 112. In FIG. 1G, defects 110 are completely removed, isolating portions 108(1), 108(2) by virtue of the fact that defects 110 are gone. In some embodiments, additional amorphous layer 116 can be added to channel 114. In some embodiments, instead of adding additional amorphous layer 116, additional semiconductor material can be added to join portions 108(1), 108(2) together. In some embodiments, electrical contacts 118, 120 can be positioned as shown in FIG. 1H. Electrical contacts can formed of various metals, including Al, Ti, Ni, Au, Ta and combinations thereof. Electricity flows between electrical contacts 118, 120 via portions 108(1), 108(2).

Partial or complete removal of defects 110 results in improved device performance. For example, reduction/removal of defects 110 reduces current leakage when device is off, enables the semiconductor to withstand higher electric fields before breaking down, and removal of defects reduces a tendency for electrons to become trapped by defects which can change how the semiconductor acts in the on state. The improved semiconductor disclosed herein can be used in a wide variety electronic devices such as transistors, including high electron mobility transistors, and laser diodes.

In exemplary embodiments, a semiconductor device is disclosed that includes a substrate 102 and semiconductor material 108 disposed on substrate 102. In some embodiments, amorphous layer 104 is deposited on substrate 102 prior to deposition of semiconductor material 108. The semiconductor device includes a means for providing improved device performance. The means for providing improved device performance includes one or more semiconductor portions 108(1), 108(2) that are isolated from defect region 112. In some embodiments, isolated semiconductor portions 108(1), 108(2) are formed by removing a portion of defect region 112 and depositing additional amorphous layer 116 on top of defect region 112 (e.g., see FIG. 1F). In some embodiments, removing a portion of defect region 112 means removing enough of defect region 112 so that, when viewed from the side of the semiconductor device, the level of the top surface of defect region 112 is below a bottom surface of portions 108(1), 108(2). In other words, defect region 112 is etched away to a level beneath the surface of amorphous layer 104. In some embodiments, the isolated semiconductor portions 108(1), 108(2) are formed by removing all or substantially all of defect region 112. Substantially all of the defect region is used herein to mean that defect region 112 is etched away to expose at least a portion of substrate 102.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, the processes described herein can be embodied within a form that does not provide all of the features and benefits set forth herein, as some features can be used or practiced separately from others. The scope of protection is defined by the appended claims rather than by the foregoing description. All changes which come within the meaning and range of equivalency of the claims are to be embraced within their scope.

The invention claimed is:

1. A semiconductor device comprising:
    a substrate layer;
    a first amorphous layer deposited on the substrate layer;
    a semiconductor layer deposited on the first amorphous layer, wherein the semiconductor layer does not contact the substrate layer;
    a channel formed into the semiconductor layer and into the first amorphous layer;
    a second amorphous layer deposited in the channel; and
    a semiconductor defect region disposed between the substrate layer and the second amorphous layer.

2. The semiconductor device of claim 1, wherein the semiconductor defect region does not contact the semiconductor layer.

3. The semiconductor device of claim 1, wherein the first and second amorphous layers each comprise a dielectric material.

4. The semiconductor device of claim 3, wherein the dielectric material comprises at least one of Si, $Al_2O_3$, SiC, GaN, AlN, InN, $Ga_2O_3$, GaAs, $Si_3N_4$, or $SiO_2$.

5. The semiconductor device of claim 1, wherein the substrate layer comprises at least one of AlN, InN, or GaN.

6. The semiconductor device of claim 1, wherein the semiconductor device is a part of a transistor.

7. The semiconductor device of claim 1, wherein the semiconductor device is a part of a diode.

8. The semiconductor of claim 1, wherein at least a portion of the semiconductor layer extends onto the first amorphous layer.

9. The semiconductor of claim 1, wherein the semiconductor defect region is disposed beneath a top surface of the first amorphous layer.

10. The semiconductor of claim 9, wherein the defect region is disposed beneath a bottom surface of the semiconductor layer.

11. The semiconductor of claim 9, further comprising an electrical contact that extends across the channel to contact the semiconductor layer on either side of the channel.

12. A semiconductor device comprising:
    a substrate layer;
    a first amorphous layer deposited on the substrate layer and comprising a channel that extends from a top surface of the first amorphous layer to a top surface of the substrate layer;
    a semiconductor layer disposed on the first amorphous layer, wherein a portion of the semiconductor layer extends onto the first amorphous layer;
    a second amorphous layer deposited in the channel; and
    a defect region of the semiconductor layer, wherein the defect region is beneath a bottom surface of the semiconductor layer and beneath a top surface of the first amorphous layer.

13. The semiconductor device of claim 12, further comprising an electrical contact that extends from a first portion of the semiconductor layer to a second portion of the semiconductor layer.

14. The semiconductor device of claim 12, wherein the first and second amorphous layers each comprise a dielectric material.

15. The semiconductor device of claim 12, wherein the dielectric material comprises at least one of Si, $Al_2O_3$, SiC, GaN, AlN, InN, $Ga_2O_3$, GaAs, $Si_3N_4$, or $SiO_2$.

16. The semiconductor device of claim 12, wherein the substrate layer comprises at least one of AlN, InN, or GaN.

17. The semiconductor device of claim 12, wherein the semiconductor device is a part of a transistor.

18. The semiconductor device of claim 12, wherein the semiconductor device is a part of a diode.

* * * * *